(12) United States Patent
Lee et al.

(10) Patent No.: US 7,041,554 B2
(45) Date of Patent: May 9, 2006

(54) METHODS OF FABRICATING FLASH MEMORY DEVICES HAVING SELF ALIGNED SHALLOW TRENCH ISOLATION STRUCTURES

(75) Inventors: Chang-Hyun Lee, Gyeonggi-do (KR); Dong-Gun Park, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/455,679

(22) Filed: Jun. 5, 2003

(65) Prior Publication Data

US 2004/0108570 A9 Jun. 10, 2004

(30) Foreign Application Priority Data

Jul. 5, 2002 (KR) ............. 10-2002-0038826

(51) Int. Cl.
*H01L 21/336* (2006.01)

(52) U.S. Cl. ............. 438/257; 438/263; 438/264; 438/424

(58) Field of Classification Search .......... 438/257, 438/263, 264, 424
See application file for complete search history.

(56) References Cited

U.S. PATENT DOCUMENTS

| 2002/0123234 A1* | 9/2002 | Trapp ............... 438/746 |
| 2003/0052376 A1* | 3/2003 | Lee et al. ........... 257/410 |
| 2003/0173615 A1* | 9/2003 | San et al. ........... 257/315 |

FOREIGN PATENT DOCUMENTS

KR  010061403  7/2001

* cited by examiner

*Primary Examiner*—Long Pham
(74) *Attorney, Agent, or Firm*—Myers Bigel Sibley & Sajovec

(57) ABSTRACT

Flash memory devices are provided including an integrated circuit substrate and a stack gate structure on the integrated circuit substrate. A trench isolation region is provided on the integrated circuit substrate adjacent the stack gate structure. A portion of the stack gate structure adjacent a trench sidewall of the trench isolation region may include a first nitrogen doped layer.

10 Claims, 18 Drawing Sheets

METHODS OF FABRICATING FLASH MEMORY DEVICES HAVING SELF ALIGNED SHALLOW TRENCH ISOLATION STRUCTURES

RELATED APPLICATION

This application is related to and claims priority from Korean Application No. 2002-38826, filed Jul. 5, 2002, the disclosure of which is hereby incorporated herein by reference as if set forth in its entirety.

FIELD OF THE INVENTION

The present invention relates to integrated circuit devices and methods of fabricating the same, and, more particularly, to flash memory devices and methods of fabricating the same.

BACKGROUND OF THE INVENTION

Integrated circuit devices using self-aligned shallow trench isolation technology may provide a reduced number of fabrication steps during manufacture of the integrated circuit device, enhanced reliability of a gate oxide layer and/or narrower threshold voltage distribution in a cell array. Accordingly, to improve performance of conventional flash memory devices, self-aligned shallow trench isolation technology has been applied to highly integrated flash memory devices typically requiring low fabrication costs and high reliability.

FIGS. 1 through 4 illustrate aspects of conventional flash memory devices. FIG. 1 is a top plan view illustrating conventional flash memory devices, FIGS. 2 and 3 are cross-sectional views illustrating conventional flash memory devices, taken along lines A–A' and B–B' of FIG. 1, respectively.

Referring now to FIGS. 1 through 3, a plurality of device isolation patterns are provided on an integrated circuit substrate 2 to define a plurality of active regions. A control gate electrode 16 crosses over the device isolation patterns. A floating gate pattern 9 is disposed between the control gate electrode 16 and the active regions. As illustrated in FIG. 2, the flash memory device further includes a trench oxide layer 6, an insulating pattern 14 and an intergate dielectric pattern 13.

The device isolation pattern includes the trench oxide layer 6 and the insulating pattern 14. The trench oxide layer 6 is provided on sidewalls of a trench region provided in the integrated circuit substrate. The insulating pattern 14 is provided in the trench region. The floating gate pattern 9 includes a lower gate pattern 4a and an upper gate pattern 8. The lower gate pattern 4a is provided between the device isolation patterns, and the upper gate pattern 8 is provided on the lower gate pattern 4a. A portion of the upper gate pattern 8 may extend on a surface of the device isolation pattern. The intergate dielectric pattern 13 is disposed between the control gate electrode 16 and the floating gate pattern 9. The intergate dielectric pattern 13 typically includes first 10, second 11 and third 12 layers of silicon oxide, silicon nitride and silicon oxide, respectively. The control gate electrode 16 typically includes first and second layers, for example, a polysilicon layer 14 on the intergate dielectric pattern 13 and a metal silicide layer 15 on the polysilicon layer 14.

As further illustrated in FIG. 3, the flash memory device further includes a tunnel insulating pattern 3 and source/drain regions S/D. The tunnel insulating pattern 3 is provided between the floating gate pattern 9 and the integrated circuit substrate 2. The source/drain regions S/D are provided in the integrated circuit substrate 2 adjacent to the floating gate pattern 9 to be aligned to sidewalls of the floating gate pattern 9. Referring again to FIG. 2, conventional flash memory devices may include a bird's beak 7 (thickening of the trench oxide layer 6) at the edge of the tunnel insulating pattern 3 adjacent to the trench oxide layer 6.

Referring now to FIG. 4, methods of forming conventional devices include forming the tunnel insulating pattern 3, a lower conductive pattern 4 and a hard mask pattern 5 on the integrated circuit substrate 2. A trench may be formed on the integrated circuit substrate and may be aligned to sidewalls of the hard mask pattern 5. A thermal oxidization process may be applied to the integrated circuit substrate 2 including having the trench to form the trench oxide layer 6 on sidewalls and a bottom of the trench. The sidewalls of the lower conductive pattern 4 may be oxidized resulting in the bird's beak 7 at the edge of the tunnel insulating pattern 3 caused by an oxygen atom diffused through an interface of the tunnel insulating pattern 3 and the lower conductive pattern 4.

Referring again to FIG. 3, the flash memory device includes a gate sidewall oxide layer 19 on the sidewalls of the control gate electrode 16 and the floating gate pattern 9. The gate sidewall oxide layer 19 may reduce the amount of etch damage of the sidewalls of the control gate electrode 16 and the floating gate pattern 9. According to conventional methods of fabrication, during formation of the gate sidewall oxide layer 19, oxygen atoms may be diffused through an interface of the intergate dielectric pattern 13 to oxidize the control gate electrode 16 and the floating gate pattern 9. Accordingly, the silicon oxide layer at the edge 18 of the intergate dielectric pattern 13 may become thicker (form a bird's beak) relative to the other portions of the intergate dielectric pattern 13. Furthermore, the oxygen atom may be diffused through the interface of the tunnel insulating pattern 3 adjacent to the source/drain regions S/D. Thus, the edge 17 of the tunnel insulating pattern adjacent to the source/drain region S/D may also become thicker (form a bird's beak).

The presence of the bird's beak on the tunnel insulating pattern and the intergate dielectric pattern may cause the reliability of the flash memory device to deteriorate and may cause an increase in the distribution of the threshold voltage in the cell array. In particular, the presence of the bird's beak on the intergate dielectric pattern may lower a coupling ratio of the flash memory device, an erase speed of the flash memory device and a write speed of the flash memory device.

SUMMARY OF THE INVENTION

Some embodiments of the present invention provide flash memory devices including an integrated circuit substrate and a stack gate structure on the integrated circuit substrate. A trench isolation region is provided on the integrated circuit substrate adjacent the stack gate structure. A portion of the stack gate structure adjacent a trench sidewall of the trench isolation region may include a first nitrogen doped layer.

In further embodiments of the present invention, the flash memory device further comprises a tunnel insulating pattern between the integrated circuit substrate and the stack gate structure. The stack gate structure may be a floating gate. The floating gate may include a lower gate pattern on the tunnel insulating layer and an upper gate pattern on the lower gate pattern. The first nitrogen doped layer may extend on a sidewall of the lower gate pattern and/or a sidewall of the tunnel insulating layer.

In still further embodiments of the present invention, the trench isolation region may include a trench floor. The flash memory device may further include a trench insulating layer on the trench floor and a lower portion of the trench sidewall and the first nitrogen doped layer may extend on an upper portion of the trench sidewall.

In some embodiments of the present invention, the flash memory device may further include a control gate electrode on the upper gate pattern of the floating gate. An intergate dielectric pattern may be provided between the upper gate pattern of the floating gate and the control gate electrode. The intergate dielectric pattern may include first, second and third layers. Second, third, fourth and fifth nitrogen doped layers may be provided on a surface of the upper gate pattern, a surface of the first layer, a surface of the second layer and a surface of the third layer, respectively. In certain embodiments of the present invention, the first layer may include silicon oxide, the second layer may include silicon nitride and the third layer may include silicon oxide.

In further embodiments of the present invention, the flash memory device further includes an insulating pattern in the trench isolation region. The insulating pattern may contact the first nitrogen doped layer on the sidewall of the lower gate pattern and the sidewall of the tunnel insulating pattern. The second nitrogen doped layer may extend onto a surface of the insulating pattern. The upper gate pattern may be wider than the lower gate pattern such that the upper gate pattern extends on a surface of the insulating pattern.

While the present invention is described above primarily with reference to flash memory devices, methods of fabricating flash memory devices are also provided.

BRIEF DESCRIPTION OF THE DRAWINGS

FIGS. 15 through 19 and FIGS. 20A through 24A are cross sectional views taken along a line A–A' of the FIG. 5 illustrating processing steps in the fabrication of integrated circuit devices according to embodiments of the present invention; and FIGS. 20B through 24B and FIGS. 25 and 26 are cross sectional views, taken along a line B–B' of FIG. 5 illustrating processing steps in the fabrication of integrated circuit devices according to embodiments of the present invention.

DETAILED DESCRIPTION

Figure 1:
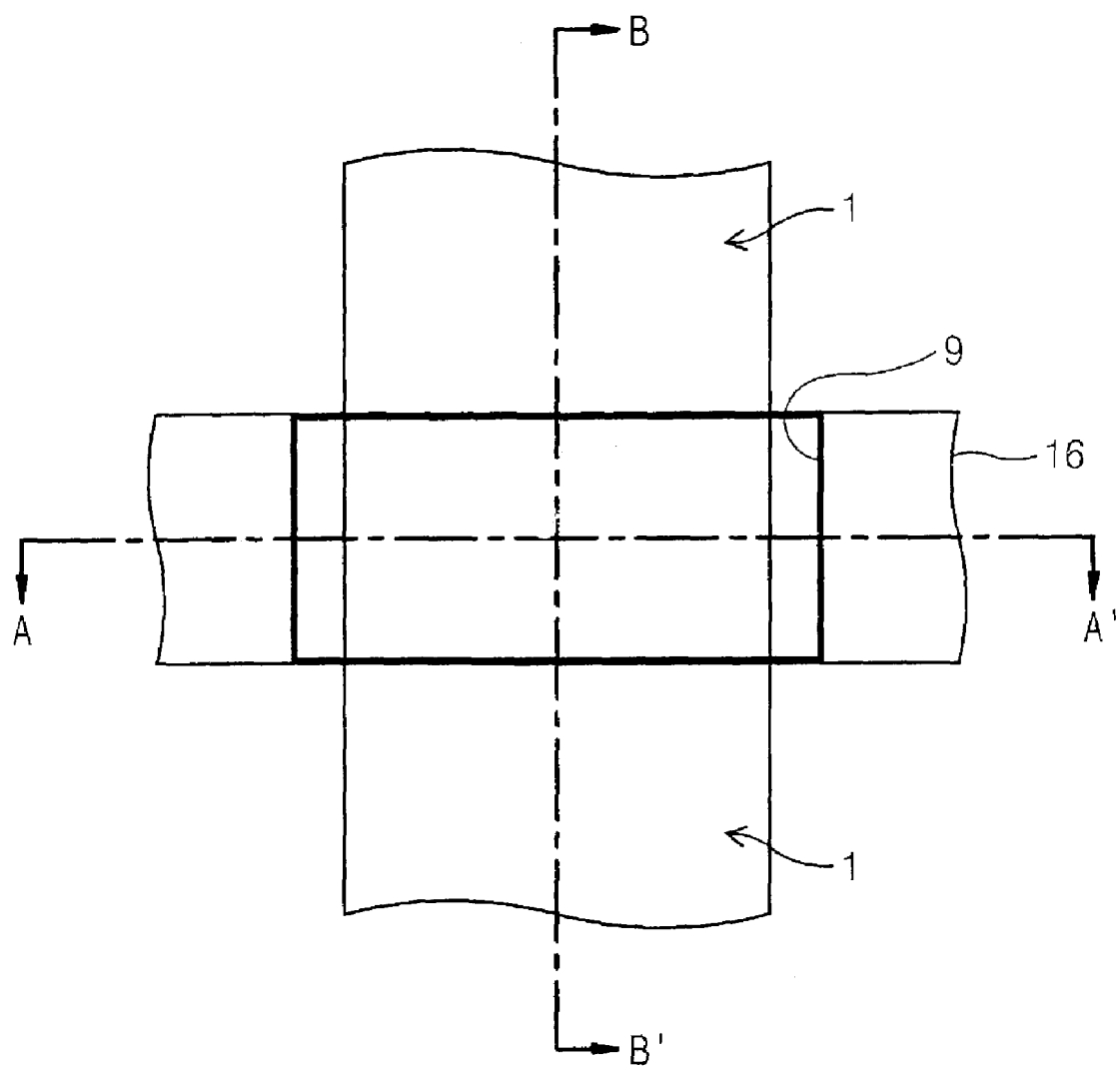
FIG. 1 is a top plan view illustrating conventional flash memory devices.
Figure 2:
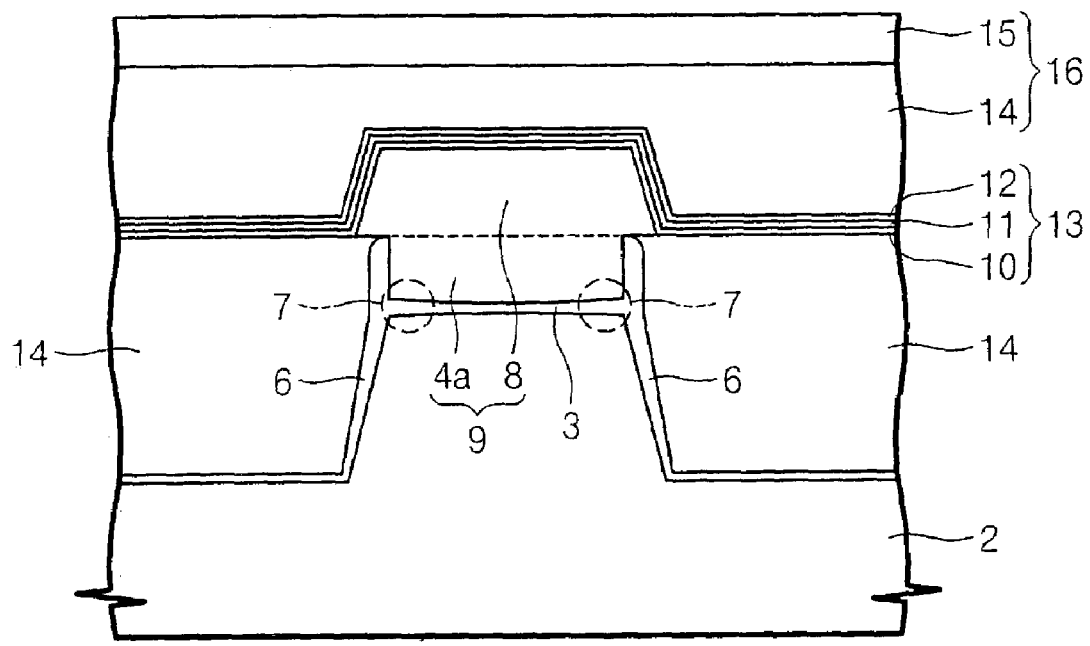
FIG. 2 is a cross-sectional view taken along the line A–A' of FIG. 1 of conventional flash memory devices.
Figure 3:
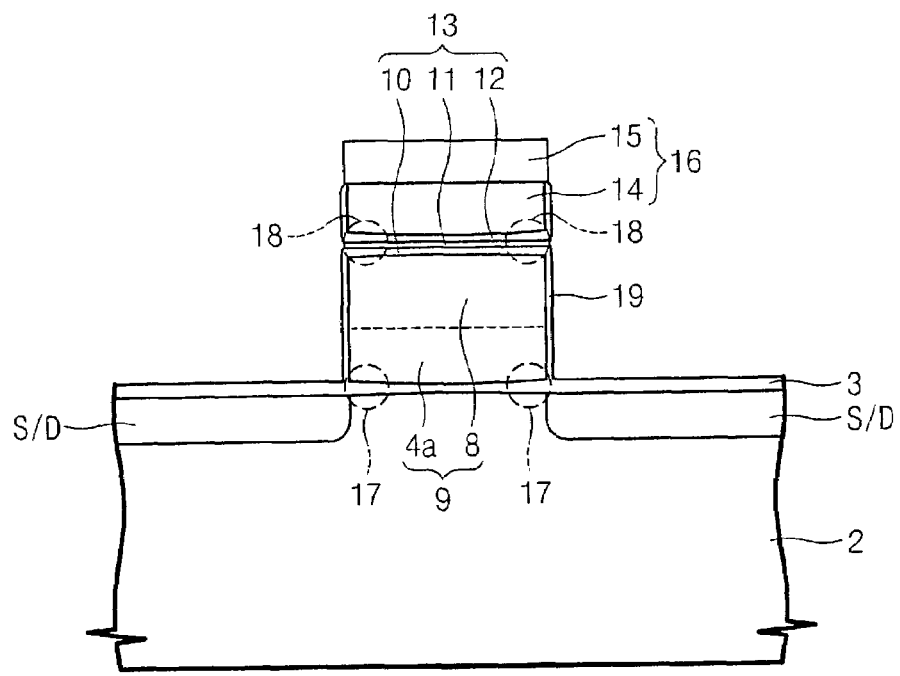
FIG. 3 is a cross-sectional view taken along the line B–B' of FIG. 1 of conventional flash memory devices.
Figure 4:
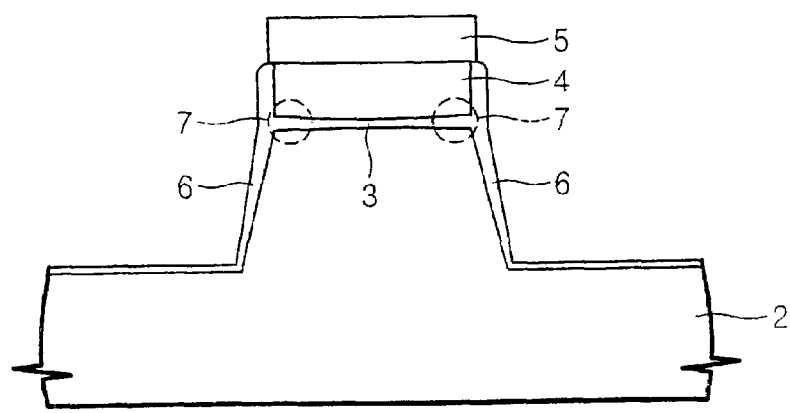
FIG. 4 is a cross-sectional view taken along the line A–A' of FIG. 1 of conventional flash memory devices.

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when a layer is referred to as being "on" another layer, it can be directly on the other layer or intervening layers may be present. In contrast, when a layer is referred to as being "directly on" another layer, there are no intervening layers present. Like reference numerals refer to like elements throughout.

It will be understood that although terms such as first, second etc. are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Embodiments of the present invention will be described below with respect to FIGS. 5 through 26. Embodiments of the present invention provide flash memory devices including an integrated circuit substrate and a stack gate structure on the integrated circuit substrate. A trench isolation region is provided on the integrated circuit substrate adjacent the stack gate structure. A portion of the stack gate structure adjacent a trench sidewall of the trench isolation region may include a first nitrogen doped layer. Furthermore, certain embodiments of the present invention provide nitrogen doped layers on other surfaces of the flash memory devices. The presence of the nitrogen doped layers may reduce the likelihood of oxygen atoms diffusing into a control gate pattern and/or a floating gate pattern of the flash memory device. Accordingly, flash memory devices according to embodiments of the present invention may provide improved device characteristics as discussed further below.

Figure 5:
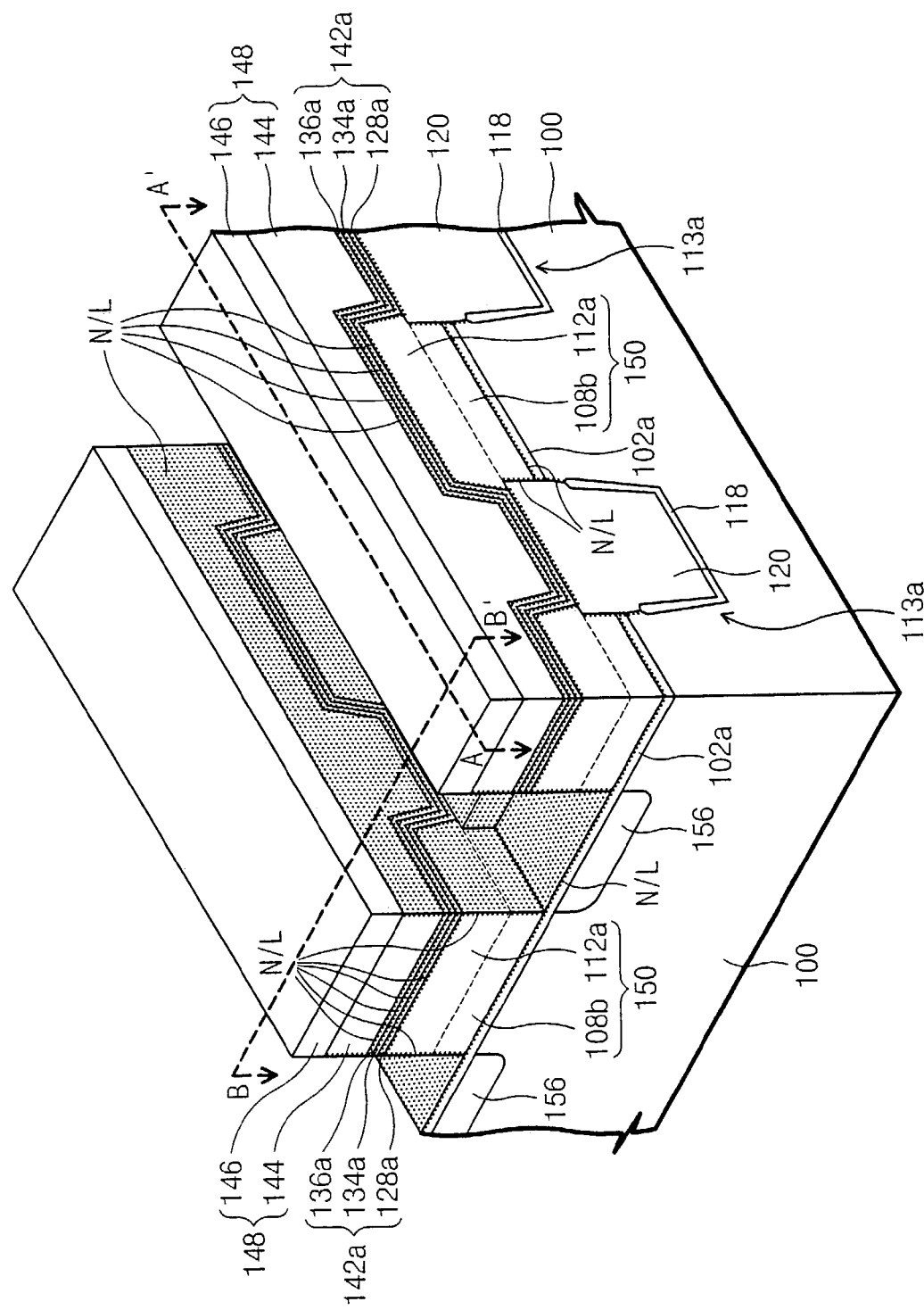
FIG. 5 is a perspective view of flash memory device according to some embodiments of the present invention.

Referring now to FIG. 5, a perspective view of flash memory devices according to embodiments of the present invention will be discussed. As illustrated in FIG. 5, flash memory devices according to embodiments of the present invention include device isolation patterns disposed parallel to an integrated circuit substrate 100. The device isolation patterns may include, for example, a trench oxide layer 118 and an insulating pattern 120. The trench oxide layer 118 may be provided on sidewalls and a bottom of a trench region 113a and the insulating pattern 120 is provided in the trench region 113a. As illustrated, the trench oxide layer 118 is not formed on an entire surface of the sidewalls of the trench region 113a. Thus, an upper portion of the sidewall of the trench region 113a that is does not include the trench oxide layer 118 may contact the insulating pattern 120.

As further illustrated in FIG. 5, flash memory devices according to embodiments of the present invention may further include a control gate electrode 148 and a floating gate pattern 150. The control gate electrode 148 crosses over the device isolation patterns. It will be understood that the control gate electrode 148 may include one or more layers without departing from the teachings of the present invention. For example, the control gate electrode 148 may include a single conductive layer or may include a polycide layer having a polysilicon layer 144 and a metal silicide layer 146 on the polysilicon layer as illustrated in FIG. 5. The floating gate pattern 150 is provided between the control gate electrode 148 and the integrated circuit substrate 100. The floating gate pattern 150 is further provided on the integrated circuit substrate between the device isolation patterns. The floating gate pattern 150 may include a lower gate pattern 108b and an upper gate pattern 112a. The upper gate pattern 112a is provided on the lower gate pattern 108b. The edge of the upper gate pattern 112a may contact a surface of the insulating pattern 120 as illustrated in FIG. 5.

As still further illustrated in FIG. 5, flash memory devices according to embodiments of the present invention further include an intergate dielectric pattern 142a and a tunnel insulating pattern 102a. The intergate dielectric pattern 142a is provided between the control gate electrode 148 and the floating gate pattern 150. The intergate dielectric pattern 142a may included first 128a, second 134a and third 136a layers, for example, a first silicon oxide layer, a silicon nitride layer on the first silicon layer and a second silicon oxide layer on the silicon nitride layer. The tunnel insulating pattern 102a is provided between the floating gate pattern 150 and the integrated circuit substrate 100. The intergate dielectric pattern 142a may be provided on the floating gate pattern 150 and the control gate electrode 148 may be provided on the intergate dielectric pattern 142a. Accordingly, together the floating gate pattern 150, the intergate dielectric pattern 142a and the control gate electrode may provide a stack gate.

The insulating pattern 120 may have sidewalls that become wider at a top portion, i.e. are vertically protruded. The lower gate pattern 108b is provided between the protruded sidewalls of adjacent insulating patterns 120 as illustrated in FIG. 5. Accordingly, sidewalls of the floating gate pattern 150 may contact the sidewalls of the insulating pattern 120, i.e. the device isolation pattern. The flash memory device further includes source and drain regions 156. The source and drain regions 156 are provided in the integrated circuit substrate adjacent to the floating gate pattern 150 and may be aligned to the sidewalls of the floating gate pattern 150.

As further illustrated in FIG. 5, the flash memory device includes further includes nitrogen doped layers N/L. The nitrogen doped layers N/L may block a diffusion route of oxygen during a fabrication process, which may improve the overall functionality of the device. In particular, a first nitrogen doped layer N/L may be provided on the upper sidewall of the trench region 113a, sidewalls of the tunnel insulating pattern 102a and/or sidewalls of the lower gate pattern 108b, which may be sequentially aligned to be in contact with the insulating pattern 120. Accordingly, it may be possible to reduce the likelihood of the formation of a bird's beak as discussed above at the edge of the tunnel insulating layer 102a adjacent to the device isolation pattern. Thus, the flash memory device may have a uniform tunnel insulating layer 102a, i.e. no thickening of the tunnel insulating layer 102a.

Furthermore, second, third, fourth and fifth nitrogen doped layers N/L may be provided on an upper surface of the upper gate pattern 112a of the floating gate pattern 150, the first layer 128a of the intergate dielectric pattern 142a, the second layer 134a of the intergate dielectric pattern 142a and the third layer 136a of the intergate dielectric pattern 142a, respectively. Thus, for example, during a gate sidewall oxidization process for curing etch damage of the stack gate sidewall, the nitrogen doped layers N/L provided on the surface of the floating gate pattern 150, the first silicon oxide layer 128a and the second silicon oxide layer 136a may reduce the amount of oxygen atoms diffused into the floating gate pattern 150 and/or the control gate electrode 148. Accordingly, it may be possible to reduce the likelihood that the edge of the floating gate pattern 150 and/or the control gate electrode 148 will be oxidized. Therefore, the intergate dielectric pattern 142a may have a uniform thickness.

In certain embodiments, a sixth nitrogen doped layer N/L may be formed on sidewalls of the stack gate pattern and on an upper surface of the tunnel insulating pattern 102a. The nitrogen doped layer N/L formed on the upper surface of the tunnel insulating pattern 102a may reduce the likelihood that oxygen atoms will penetrate through interfaces between the tunnel insulating pattern 102a and the floating gate pattern 150. The tunnel insulating pattern 102a may be provided on the integrated circuit substrate between the stack gate patterns or may be provided between the floating gate pattern 150 and the integrated circuit substrate 100. The sixth nitrogen doped layer N/L formed on the sidewalls of the stack gate pattern may be provided before the gate sidewall oxidization process. Accordingly, in embodiments of the present invention where the tunnel insulating pattern 102a exists only under the floating gate pattern 150, the sixth nitrogen doped layer N/L may be provided on the sidewalls of the tunnel insulating pattern 102a adjacent to the source/drain region 156. Thus, it may be possible to reduce the likelihood that oxygen atoms will be diffused through the sidewalls of the tunnel insulating pattern 102a.

It will be understood that the perspective view of the flash memory device illustrated in FIG. 5 is provided for exemplary purposes only and that embodiments of the present invention are not limited to this configuration. Features may be added and/or deleted from the flash memory device illustrated in FIG. 5 without departing from the teachings of the present invention.

Figure 6:
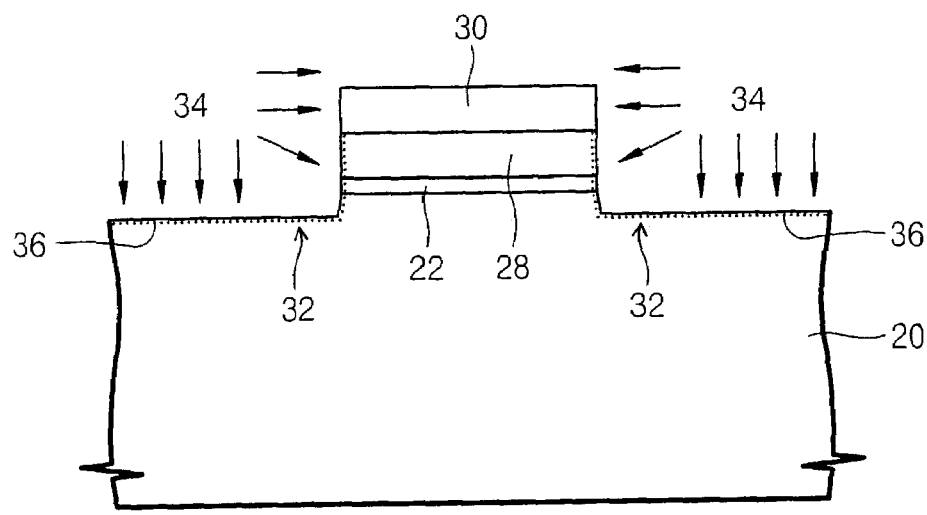
FIGS. 6 through 14 are cross sectional views illustrating processing steps in the fabrication of integrated circuit devices according to embodiments of the present invention.

Referring now to FIGS. 6 through 9, cross sectional views illustrating processing steps in the fabrication of integrated circuit devices according to embodiments of the present invention will be discussed. As illustrated in FIG. 6, flash memory devices according to embodiments of the present invention include a tunnel insulating layer on an integrated circuit substrate 20, a lower conductive layer on the tunnel insulating layer and a mask layer, for example, a hard mask layer, on the lower conductive layer in order to form a self-aligned shallow trench isolation structure. The mask layer, the lower conductive layer and the tunnel insulating layer may be successively patterned to form a tunnel insulating pattern 22 on the integrated circuit substrate 20, a lower conductive pattern 28 on the tunnel insulating pattern 22 and a mask pattern 30, for example, a hard mask pattern, on the lower conductive pattern. The lower conductive pattern 28 may include, for example, polysilicon. The integrated circuit substrate 20 may be partially etched using, for example, the hard mask pattern 30 as an etch mask, to form a pre-trench region 32 aligned to sidewalls of the hard mask pattern 30. A nitrogen doped layer 36 may be formed on the sidewalls of the lower conductive pattern 28, the sidewalls of the tunnel insulating pattern 22 and the pre-trench region 32.

In certain embodiments of the present invention, the nitrogen doped layer 36 may be formed by a plasma nitridation process. In particular, the integrated circuit substrate 20 including the pre-trench region 32 may be disposed in a process chamber. A plasma 34 may be generated in the process chamber using, for example, $N_2$, $NH_3$, NO and/or $N_2O$, as a source gas. A plasma density within the process chamber may be set to about $1 \times 10^{10}$ $cm^{-3}$ to about $1 \times 10^{12}$ $cm^{-3}$ and a pressure within the process chamber may be set to about $1{-}300$ mT. In certain embodiments, a temperature of the substrate may be set from about 300° C. to about 900° C. and a plasma exposure time may be set to from about 10 seconds to about 60 seconds.

In further embodiments of the present invention, the nitrogen doped layer 36 may be formed by applying a remote plasma nitridation process (RPN). The RPN process is a method of jetting a nitrogen plasma into the process chamber after forming the plasma in remote chamber. The plasma exposure time of the substrate may be adjusted and the nitrogen doped layer with a high concentration may be formed at a surface of target materials. The plasma density within the process chamber of the RPN process may be set to from about $1 \times 10^{10}$ cm$^{-3}$ to about $1 \times 10^{12}$ cm$^{-3}$, and the pressure within the process chamber of the RPN process may be set to about $1^{-300}$ mT. Furthermore, the temperature of the substrate may be set to from about 300° C. to about 900° C., and the plasma exposure time may be set to from about 10 seconds to about 60 seconds.

In still further embodiments of the present invention, the nitrogen doped layer 36 may be formed by annealing the integrated circuit substrate 20 including the pre-trench region 32 in a gas including a nitrogen ambient. In these embodiments of the present invention, nitrogen atoms combine with silicon atoms of the tunnel insulating pattern 22, the lower conductive pattern 28 and the integrated circuit substrate 20 to form the nitrogen doped layer 36. The integrated circuit substrate may be heated at a temperature of from about 300° C. to about 900° C. The gas including nitrogen may be, for example, $N_2$, $NH_3$, NO and/or $N_2O$.

Figure 7:
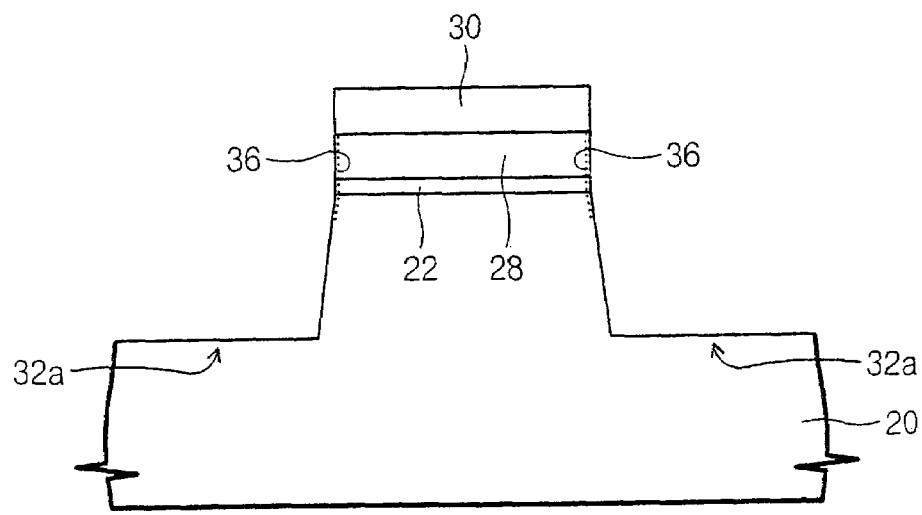

Referring now to FIG. 7, the substrate 20 including the nitrogen doped layer 36 is etched using, for example, the hard mask pattern 30 as the etch mask, to form a trench region 32a aligned to the sidewalls of the hard mask pattern 30. The nitrogen doped layer 36 may remain on the sidewalls of the lower conductive pattern 28, the sidewalls of the tunnel insulating pattern 22 and upper sidewalls of the trench region 32a as illustrated in FIG. 7.

Figure 8:
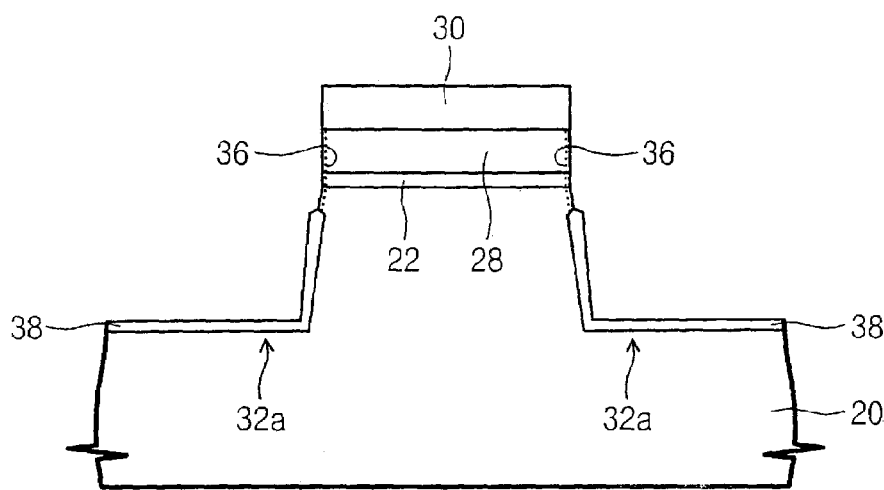

Referring now to FIG. 8, a thermal oxidization process may be applied to the integrated circuit substrate to, for example, cure etch damage that may have occurred during etch of the trench region 32a. A trench insulating layer 38 is formed at sidewalls and a bottom of the trench region 32a. The trench insulating layer 38 may, for example, be an oxide layer. As illustrated, the trench insulating layer 38 is not formed on the nitrogen doped layer 36. As discussed above, the nitrogen doped layer 36 may reduce the likelihood that oxygen atoms will react with the silicon atom of the substrate 20 and the silicon atom of the lower conductive pattern 28. Furthermore, the nitrogen doped layer 36 formed on the sidewalls of the tunnel insulating pattern 22 may reduce the likelihood that oxygen atoms will be diffused through interfaces of the tunnel insulating layer 22. Thus, it may be possible to reduce the likelihood that a bird's beak will form, i.e. that the edge of the tunnel insulating pattern 22 will become thicker.

Figure 9:
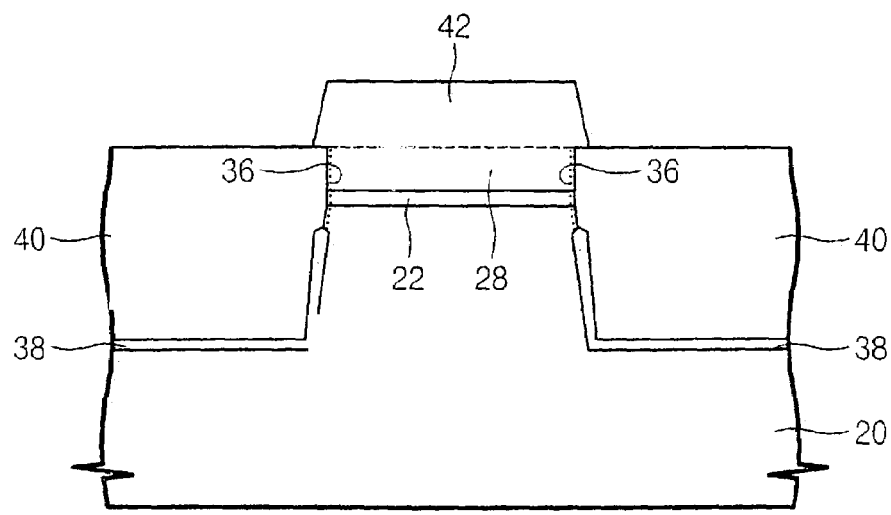

Referring now to FIG. 9, an insulating layer is formed on the surface of the substrate. The insulating layer may be planarized by, for example, a chemical mechanical polishing (CMP) process and the hard mask pattern 30 may be removed to form an insulating pattern 40 in the trench region 32a. The insulating pattern 40 and the trench insulating layer 38 constitute a device isolation pattern. The insulating pattern 40 may include a single layer or multiple layers. In certain embodiments, the insulating layer may include a silicon oxide layer, for example, a high-density plasma oxide layer or a plasma enhanced oxide layer (PEOX). A PEOX typically has excellent burial characteristic. In some embodiments of the present invention, a thin silicon nitride layer may be formed before the oxide layer is formed. A conductive layer is formed on the surface of the integrated circuit substrate 20 where the hard mask pattern 30 has been removed. The conductive layer is patterned to form an upper conductive pattern 42 on the lower conductive pattern 28. The upper conductive pattern 42 may include, for example, a similar material to the material of the lower conductive pattern 28, for example, polysilicon. As illustrated in FIG. 9, an edge of the upper conductive pattern 42 may extend onto a surface of the insulating pattern 40, for example, an oxide pattern. This overlap may reduce the likelihood that the lower conductive pattern 28 will be damaged by inadvertent misalignment of aspects of the device.

As discussed above, according to methods of forming flash memory devices according to embodiments of the present invention, one or more nitrogen doped layers may reduce the likelihood that oxygen atoms will be diffused through the interfaces of the tunnel insulating pattern 22 during thermal oxidization. Thus, it may be possible to reduce the likelihood that a bird's beak will be formed at the edge of the tunnel insulating pattern adjacent to the device isolation pattern.

Figure 10:
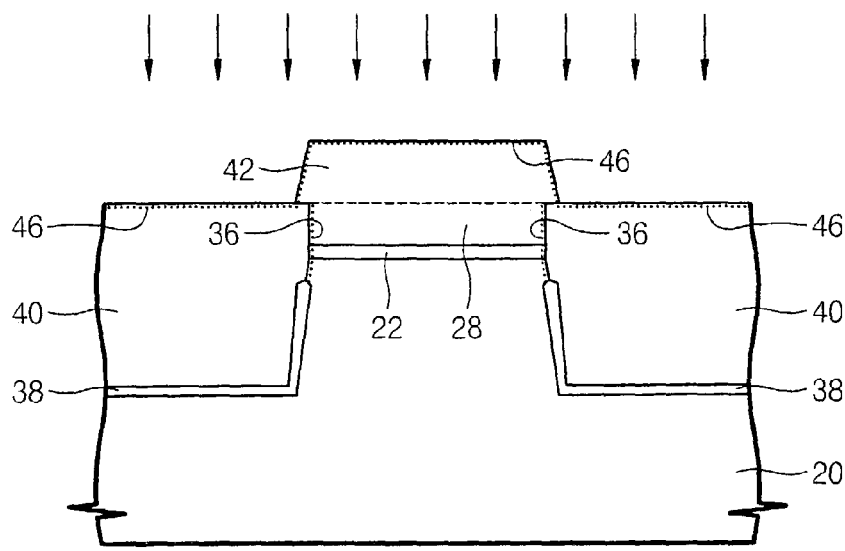
Figure 11:
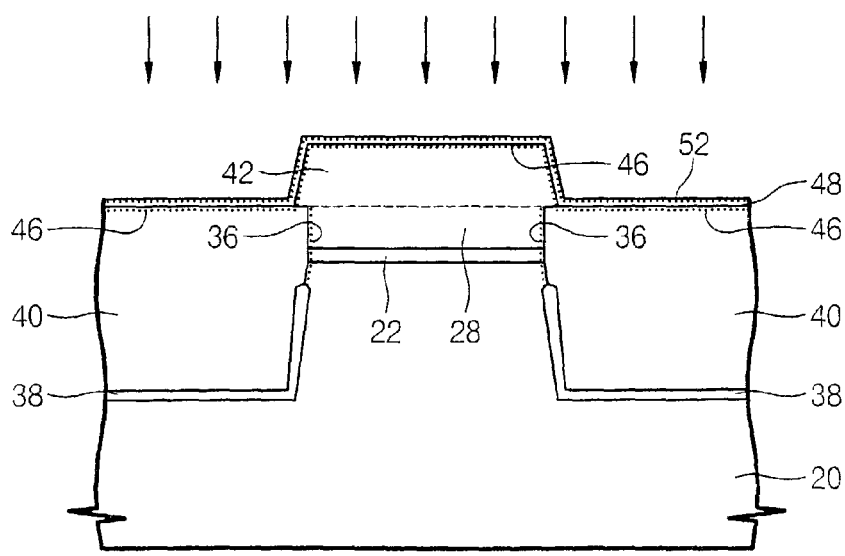
Figure 12:
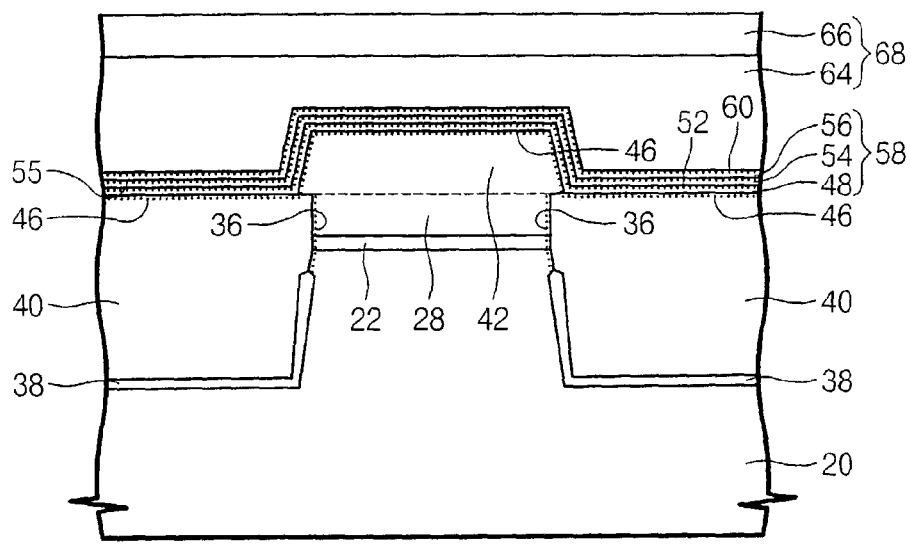

Referring now to FIGS. 10 through 12, cross sectional views illustrating processing steps in the fabrication of integrated circuit devices according to embodiments of the present invention will be discussed. As illustrated in FIG. 10, a nitrogen doped layer 46 is formed on an upper surface of the upper conductive pattern 42 and on an upper surface of the insulating pattern 40. As further illustrated in FIG. 11, a first layer 48, for example, a first silicon oxide layer, is formed on a surface of the integrated circuit substrate 20 on the layer 48.

Referring now to FIG. 12, a second layer 54, for example, a silicon nitride layer, is formed on the first layer 48 and a nitrogen doped layer 55 is formed on an upper surface of the second layer 54. A third layer 56, for example, a second silicon oxide layer, is formed on the second layer 54 and a nitrogen doped layer 60 is formed on an upper surface of the third layer 56. An intergate dielectric layer 58 includes the first 46, the second 54 and third 56 layers.

It will be understood that the nitrogen doped layers 46, 52 and 60 may be formed using at least one of the methods discussed above with respect to the nitrogen doped layer 36. In particular, the nitrogen doped layers 46, 52 and 60 may be formed by the plasma nitridation process, the RPN process, and/or by annealing the substrate in the gas including the nitrogen ambient.

A gate conductive layer 68 is formed on the second silicon oxide layer 56. The gate conductive layer 68, the intergate dielectric layer 58, the upper conductive pattern 42, and the lower conductive pattern 28 are successively patterned to form a stack gate that crosses over the device isolation patterns. Although not shown in the Figures, the stack gate may include a floating gate pattern, an intergate dielectric pattern and a control gate pattern, which are sequentially stacked. The tunnel insulating pattern 22 between the stack gate patterns may be etched during formation of the gate stack pattern. The gate conductive layer 68 may include polysilicon and/or a polycide layer including a polysilicon layer 64 and a metal silicide layer 66 as illustrated in FIG. 12.

As discussed above, nitrogen doped layers according to embodiments of the present invention are formed at oxygen diffusion routes such as the interfaces between the first silicon oxide layer and the conductive pattern, the interfaces between the first silicon oxide layer and the silicon nitride layer, and the interfaces between the second silicon oxide layer and the polysilicon layer. Accordingly, for example, during the thermal oxidization process, it may be possible to reduce the possibility of a reaction between the silicon atoms of the gate conductive layer and the upper conductive pattern and the oxygen atoms diffused through the interfaces of the intergate dielectric layer. Thus, the likelihood that the edge of the intergate dielectric layer, for example, the edge of the first silicon oxide layer and the second silicon oxide layer, will become thicker may be reduced.

Figure 13:
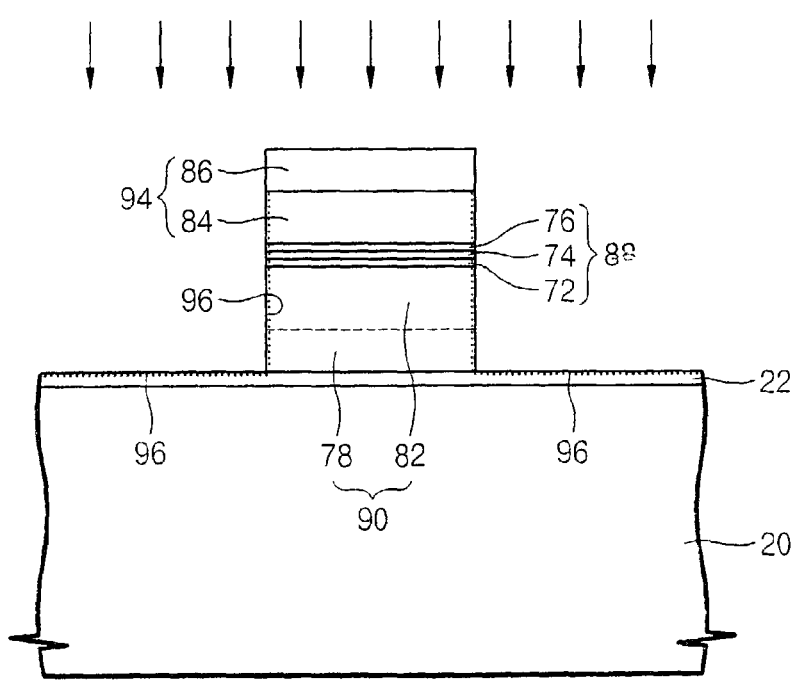
Figure 14:
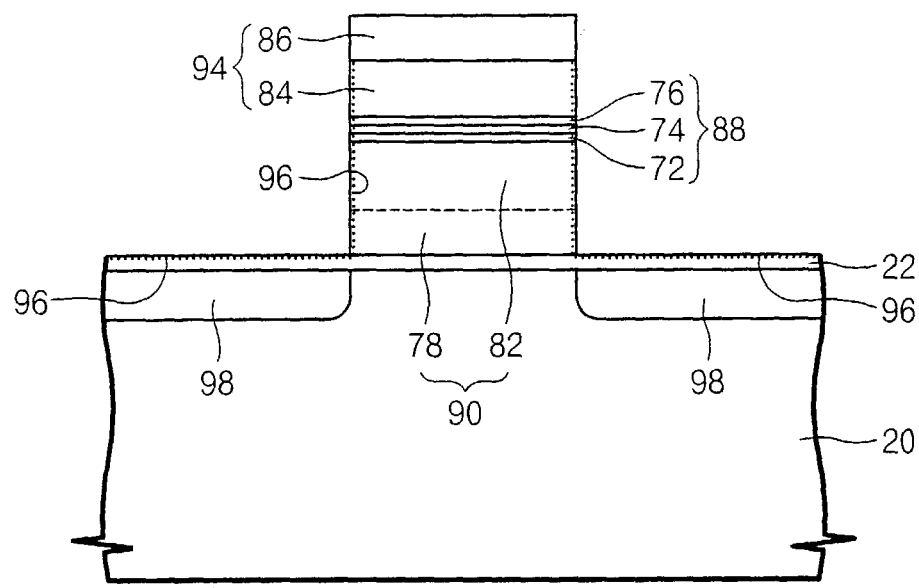

Referring now to FIGS. 13 and 14, cross sectional views illustrating processing steps in the fabrication of integrated circuit devices according to embodiments of the present invention will be discussed. As illustrated in FIGS. 13 and 14, the tunnel insulating layer 22 is formed on the integrated circuit substrate 20. The stack gate is formed on the tunnel insulating layer 22. The stack gate includes a floating gate pattern 90, an intergate dielectric pattern 88 on the floating gate pattern 90 and a control gate pattern 94 on the floating gate pattern 90. The floating gate pattern 90 may include a lower gate pattern 78 and an upper gate pattern 82. It will be understood that the floating gate pattern 90 may also include a single pattern without departing from the teachings of the present invention. The control gate pattern 94 may include a polysilicon layer 84 or a metal polycide layer that includes the polysilicon layer 84 and a metal silicide layer 86 as illustrated in FIG. 13.

A nitrogen doped layer 96 is formed on sidewalls of the stack gate and on a surface of the tunnel insulating layer 22. The nitrogen doped layer 96 may be formed using the plasma nitridation process, using the RPN process, or by annealing the substrate in the gas including nitrogen ambient as discussed above. The integrated circuit substrate 20 may be annealed to, for example, cure damage of the sidewalls of the stack gate pattern caused by the etch of the stack gate. Source and drain regions 98 may be formed in the integrated circuit substrate adjacent to the stack gate pattern.

Although not shown in the figure, the tunnel insulating layer 22 is patterned to remain only at a lower portion of the floating gate pattern 90 during formation of the stack gate pattern. In these embodiments of the present invention, the nitrogen doped layer 96 may be formed on the sidewalls of the tunnel insulating layer interposed between the floating gate pattern 90 and the integrated circuit substrate 20. During the process of oxidizing the gate sidewalls, the nitrogen doped layer 96 may reduce the likelihood that the silicon atoms of the integrated circuit substrate 20, the floating gate pattern 90 and the control gate electrode 94 will react with the oxygen atom and form an oxide layer. Thus, it may be possible to reduce the likelihood that the tunnel insulating layer on the sidewalls of the stack gate pattern and the edge of the intergate dielectric pattern 88 will become thicker.

Referring now to FIGS. 15 through 26, cross sectional views of processing steps in the fabrication of integrated circuit devices according to embodiments of the present invention will be discussed. FIGS. 15 through 19 and FIGS. 20A through 24A are cross sectional views taken along a line A–A' of the FIG. 5. FIGS. 20B through 24B and FIGS. 25 and 26 are cross-sectional views taken along a line B–B' of the FIG. 5

Figure 15:
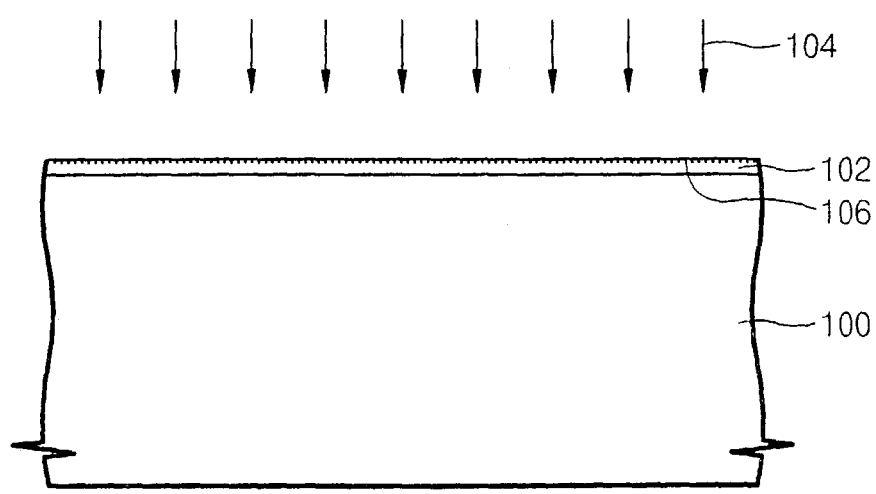

Referring now to FIG. 15, a tunnel insulating layer 102 is formed on the integrated circuit substrate 100. Nitrogen 104 may be implanted into the tunnel insulating layer 102 to form a nitrogen doped layer 106 on an upper surface of the tunnel insulating layer 102. It will be understood that the nitrogen doped layer 106 may be eliminated without departing from the teachings of the present invention. The nitrogen doped layer 106 may be formed by a plasma nitration process, a remote plasma nitridation process (RPN) and/or by annealing the integrated circuit substrate in a gas including nitrogen ambient as discussed above.

Figure 16:
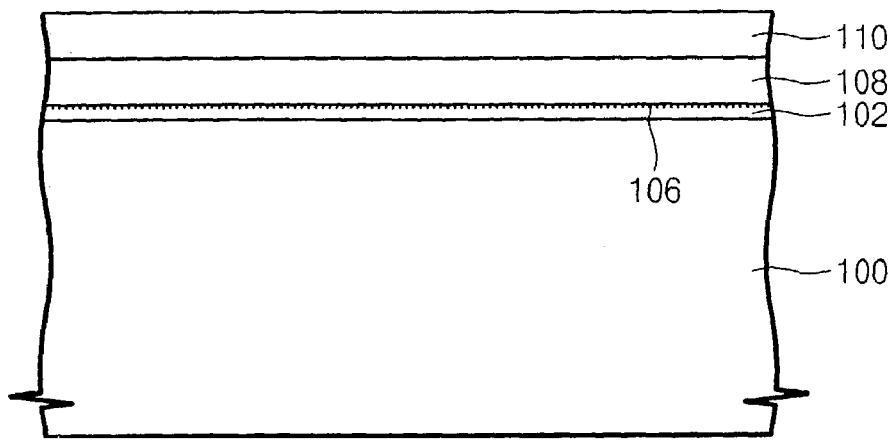
Figure 17:
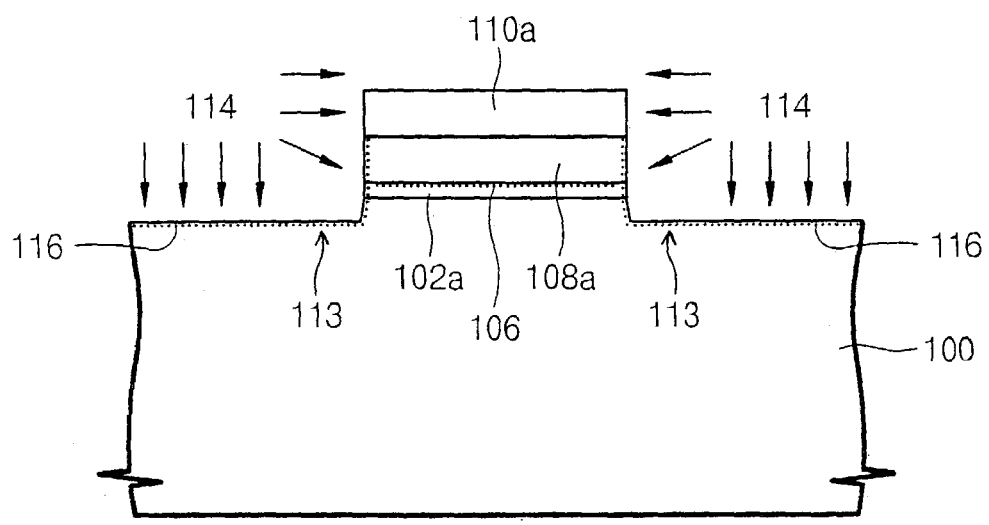

Referring now to FIG. 16, a lower conductive layer 108 and a hard mask layer 110 are sequentially stacked on the tunnel insulating layer 102. The lower conductive layer 108 may include, for example, polysilicon, and the hard mask layer 110 may, for example, include silicon nitride. As illustrated in FIG. 17, the hard mask layer 110, the lower conductive layer 108 and the tunnel insulating layer 102 are successively patterned to form a tunnel insulating pattern 102a, a lower conductive pattern 108a and a hard mask pattern 110a, which are sequentially stacked on the integrated circuit substrate 100. The lower conductive pattern 108a may include, for example, polysilicon.

The integrated circuit substrate 100 is partially etched using, for example, the hard mask pattern 110a, as an etch mask to form a pre-trench region 113 aligned to sidewalls of the hard mask pattern 110a. A nitrogen doped layer 116 is formed on sidewalls and a bottom of the lower conductive pattern 108a, the tunnel insulating pattern 102a and the pre-trench region 113. The nitrogen doped layer 116 may be formed by the plasma nitridation process, the RPN process and/or by annealing the substrate in a gas including nitrogen ambient as discussed above.

Figure 18:
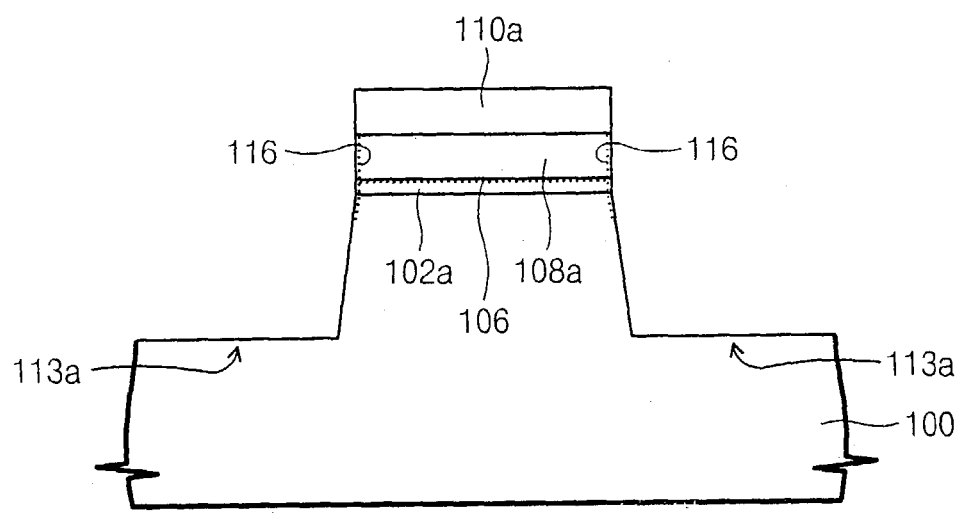

Referring now to FIG. 18, the integrated circuit substrate 100 is etched using, for example, the hard mask pattern 10a as the etch mask, to form a trench region 113a aligned to the sidewalls of the hard mask pattern 110a. The nitrogen doped layer 116 remains on the sidewalls of the lower conductive pattern 108a, the sidewalls of the tunnel insulating pattern 102a and the upper sidewalls of the trench region 1113a.

Figure 19:
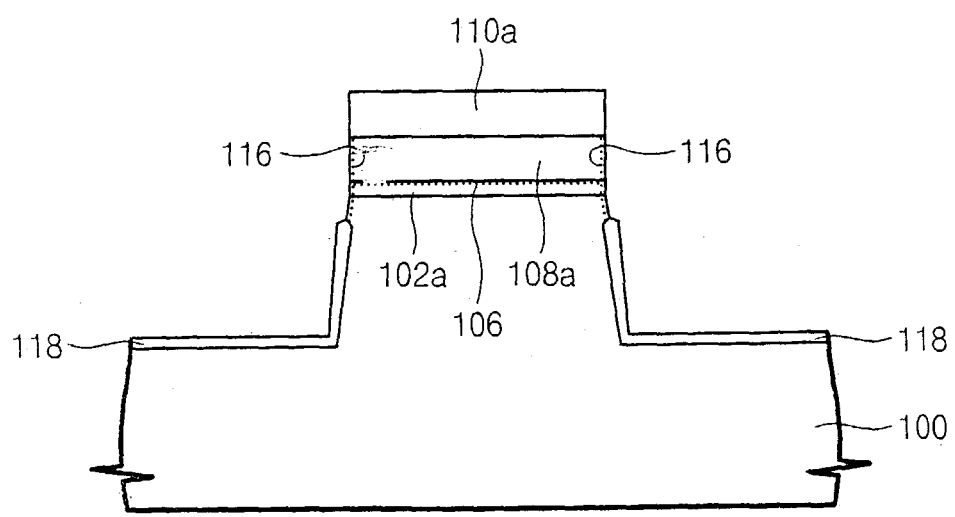

Referring now to FIG. 19, a thermal oxidization process is applied to the integrated circuit substrate 100 to, for example, cure etch damage that may have occurred during a the etch of the trench region 113a. A trench oxide layer 118 is formed on the sidewalls and the bottom of the trench region 113a. As illustrated, the trench oxide layer 118 is not formed on an upper portion of the sidewalls of the trench region 113a, i.e. the trench oxide layer is not formed on the nitrogen doped layer 116. The nitrogen doped layer 116 may reduced the likelihood that oxygen atoms will react with the silicon atoms of the integrated circuit substrate 100 and the lower conductive pattern 108a. Thus, as discussed above, it may be possible to reduce that likelihood of the formation of a bird's beak, i.e. thickening of the edge of the tunnel insulating pattern 102a. Furthermore, the nitrogen doped layer 116 formed on the upper surface of the tunnel insulating pattern 102a may reduce the likelihood that the lower conductive pattern 108a will be oxidized. In certain embodiments of the present invention, the lower conductive pattern 108a may include polysilicon, which may be oxidized more easily as compared with a single crystalline silicon.

Figure 20A:
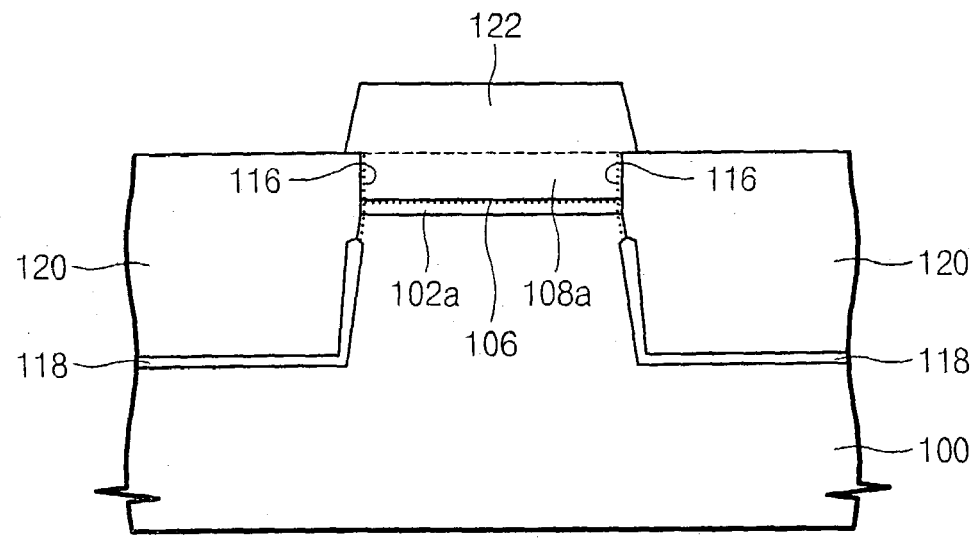
Figure 20B:
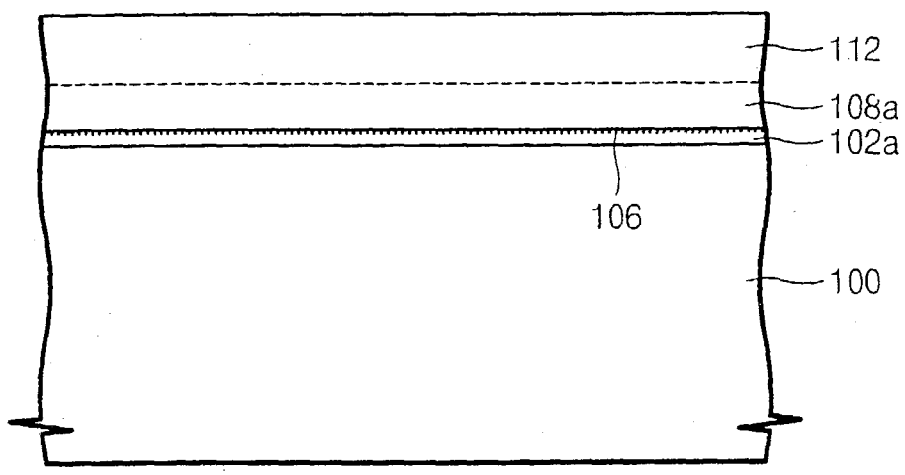

Referring now to FIGS. 20A and 20B, an insulating layer is formed on a surface of the integrated circuit substrate 100. The insulating layer is planarized by, for example, a chemical mechanical polishing (CMP) process. The hard mask pattern 110a may be removed to form an insulating pattern 120 in the trench region 113a. The insulating pattern 120 and the trench oxide layer 118 constitute a device isolation pattern. The insulating layer may be include a single layer or multiple layers. For example, the insulating layer may include a silicon oxide layer such as a high-density plasma oxide layer or a plasma enhanced oxide layer (PEOX). PEOX typically has an excellent burial characteristic. In certain embodiments of the present invention, a thin silicon nitride layer may be formed before the oxide layer is formed.

A conductive layer is formed on the surface of the integrated circuit substrate 100. The conductive layer is patterned to form an upper conductive pattern 122 on the lower conductive pattern 108a. The upper conductive pattern 122 may include, for example, polysilicon, similar to the lower conductive pattern 108a. As illustrated, the edge of the upper conductive pattern 122 may extend on a surface of the insulating pattern 120, for example, an oxide pattern.

Figure 21A:
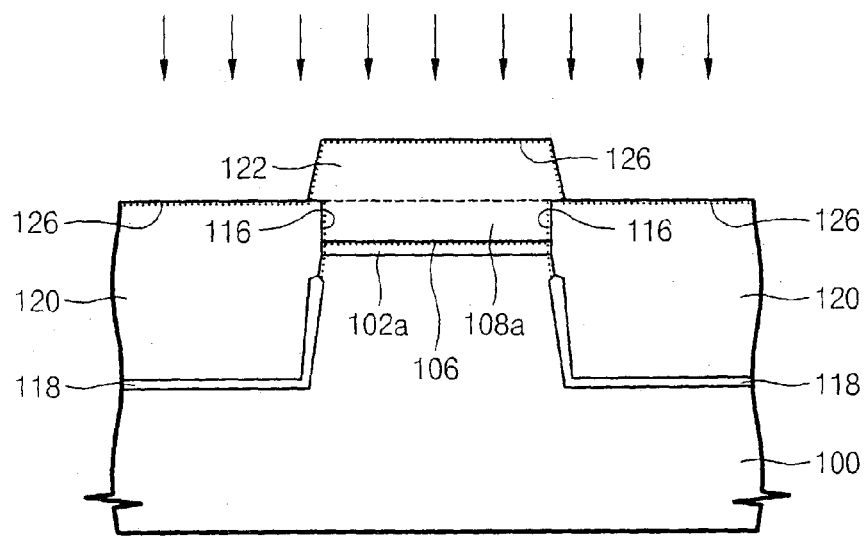
Figure 21B:
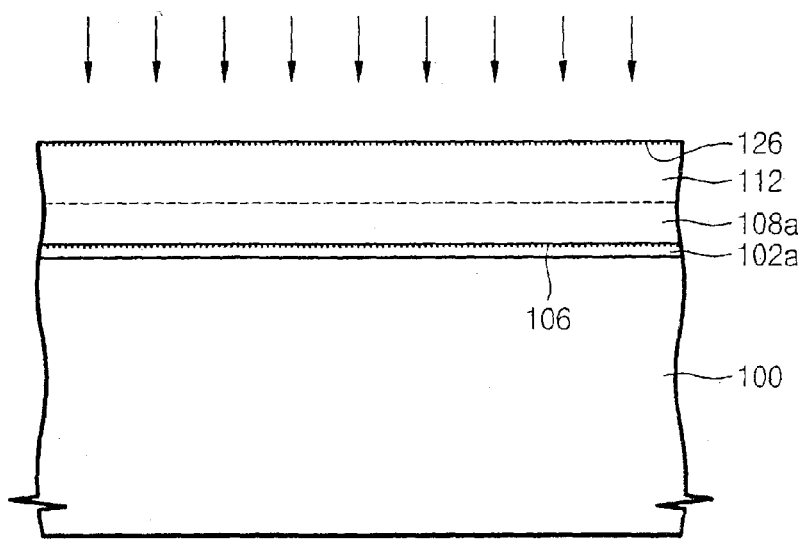
Figure 22A:
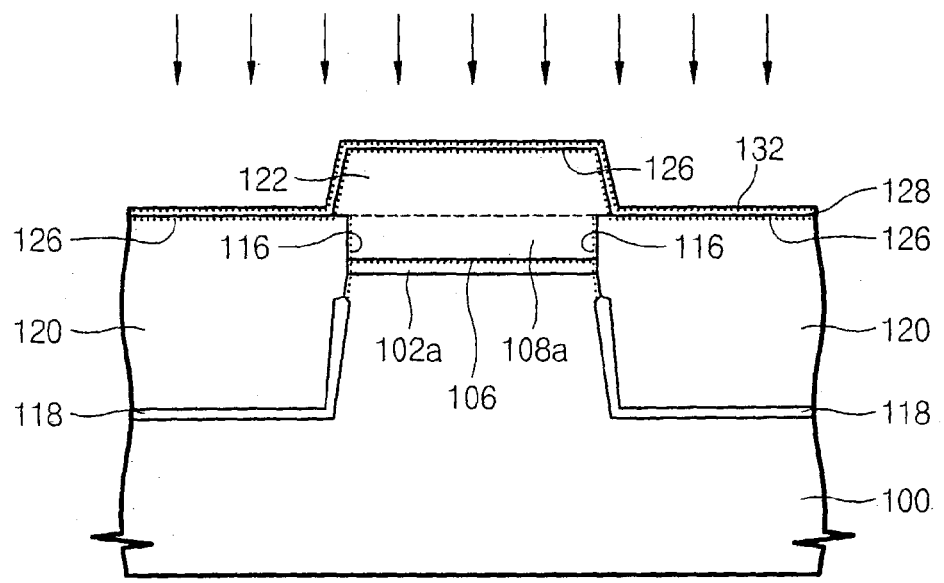
Figure 22B:
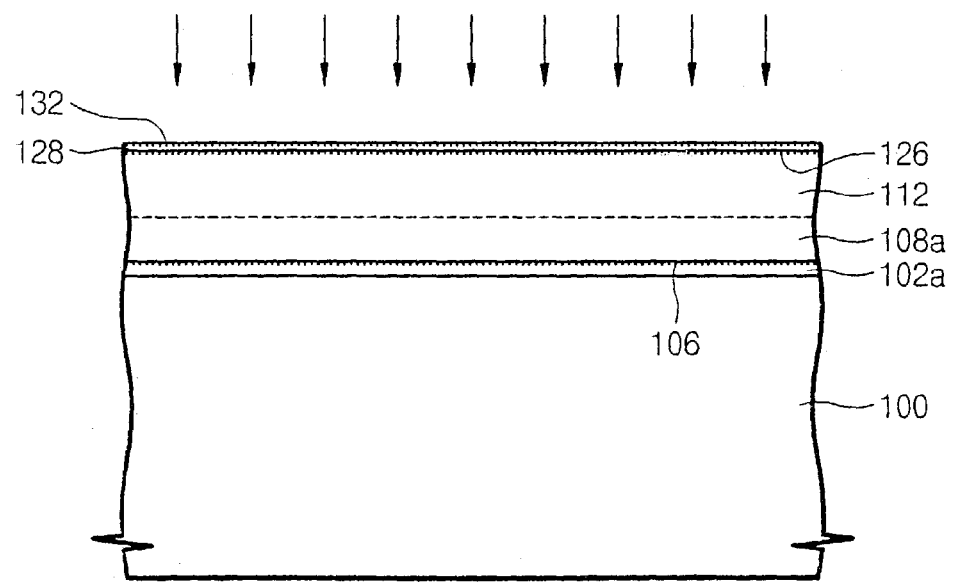

Referring to now to FIGS. 21A and 21B, a nitrogen doped layer 126 is formed on an upper surface of the upper conductive pattern 122 and an upper surface of the insulating pattern 120. As illustrated in FIGS. 22A and 22B, a first silicon oxide layer 128 is formed on the nitrogen doped layer 126. A nitrogen doped layer 132 is formed on an upper surface of the first silicon oxide layer 128.

Figure 23A:
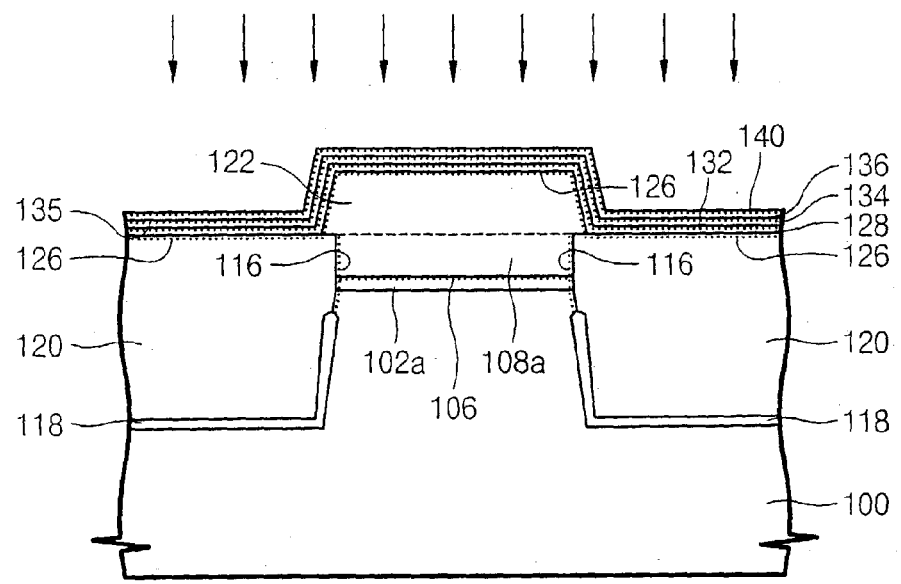
Figure 23B:
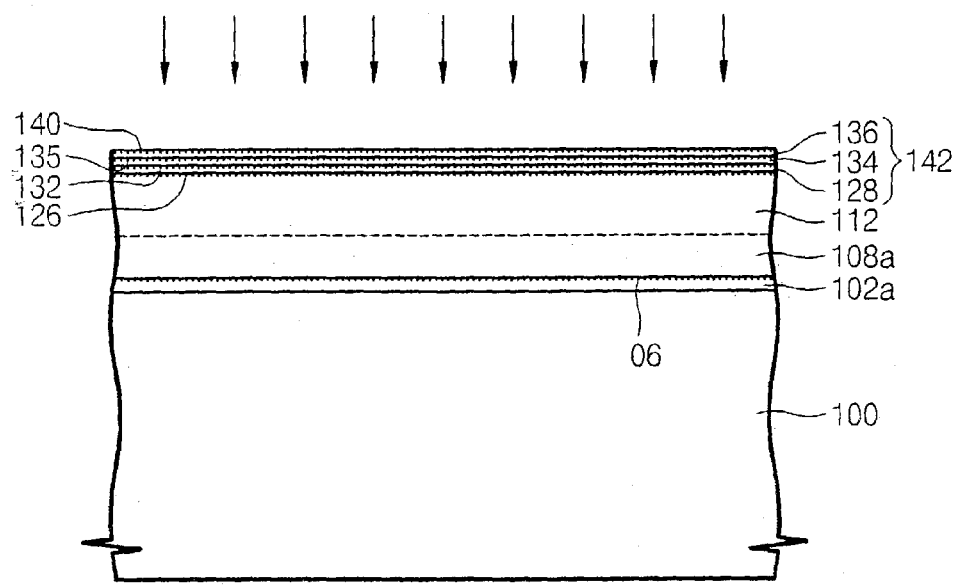

Referring now to FIGS. 23A and 23B, a silicon nitride layer 134 is formed on the first silicon oxide layer 128 and a nitrogen doped layer 135 is formed on an upper surface of the silicon nitride layer 134. A second silicon oxide layer 136 is formed on the silicon nitride layer 134 and a nitrogen doped layer 140 is formed on an upper surface of the second silicon oxide layer 136. An intergate dielectric layer 142 includes the first silicon oxide layer 128, the silicon nitride layer 134 and the second silicon oxide layer 136. The nitrogen doped layers 126, 132, 135, and 140 may be formed using the plasma nitridation process, using the RPN process and/or by annealing the substrate in the gas including nitrogen ambient as discussed above.

Figure 24A:
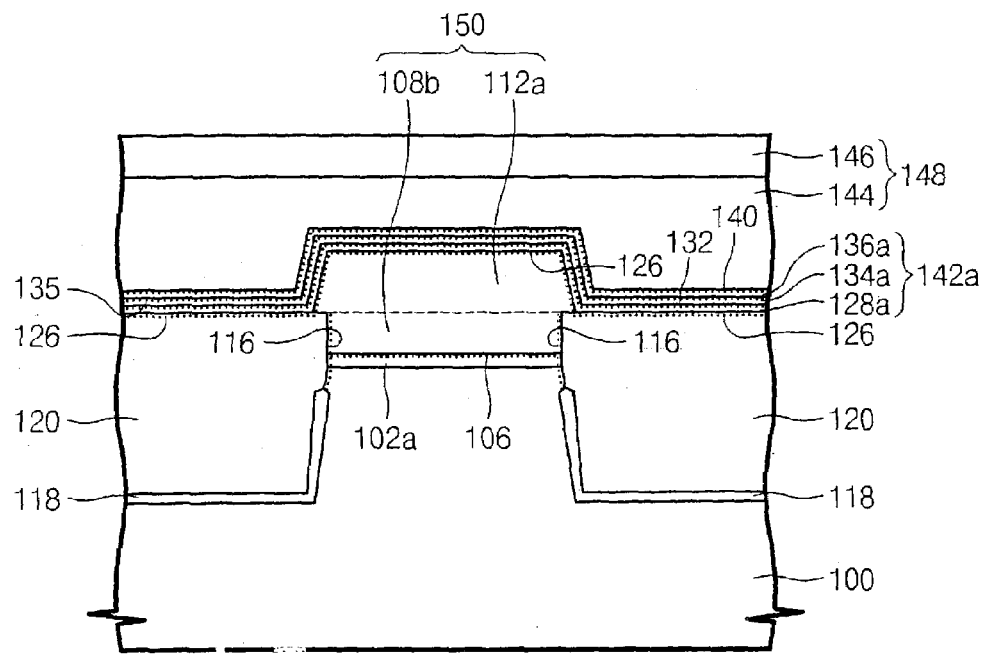
Figure 24B:
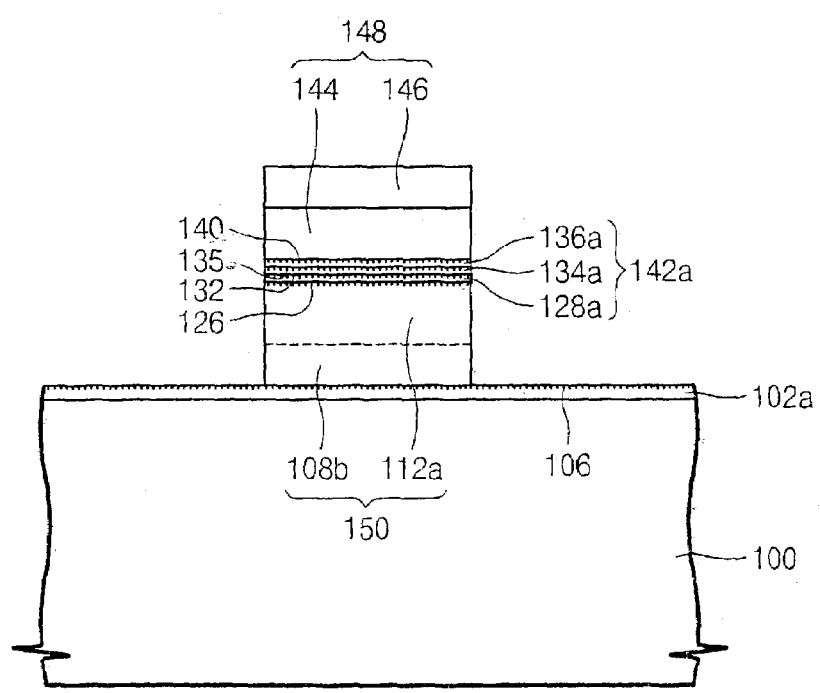

Referring now to FIGS. 24A and 24B, a gate conductive layer is formed on the second silicon oxide layer 136. The gate conductive layer, the intergate dielectric layer 142, the upper conductive pattern 122 and the lower conductive pattern 108a are successively patterned to form a stack gate crossing over the device isolation patterns. The stack gate includes a floating gate pattern 150, an intergate dielectric pattern 142a on the floating gate pattern 150 and a control gate pattern 148 on the intergate dielectric pattern 142a. The tunnel insulating layer 102a between the stack gate patterns may be etched during formation of the stack gate pattern. The control gate electrode 148 may include polysilicon or a polycide layer that includes a polysilicon layer 144 and a metal silicide layer 146 as illustrated in the Figures. The floating gate pattern 150 may include a lower gate electrode 108b and an upper gate electrode 112a on the lower gate electrode.

Figure 25:
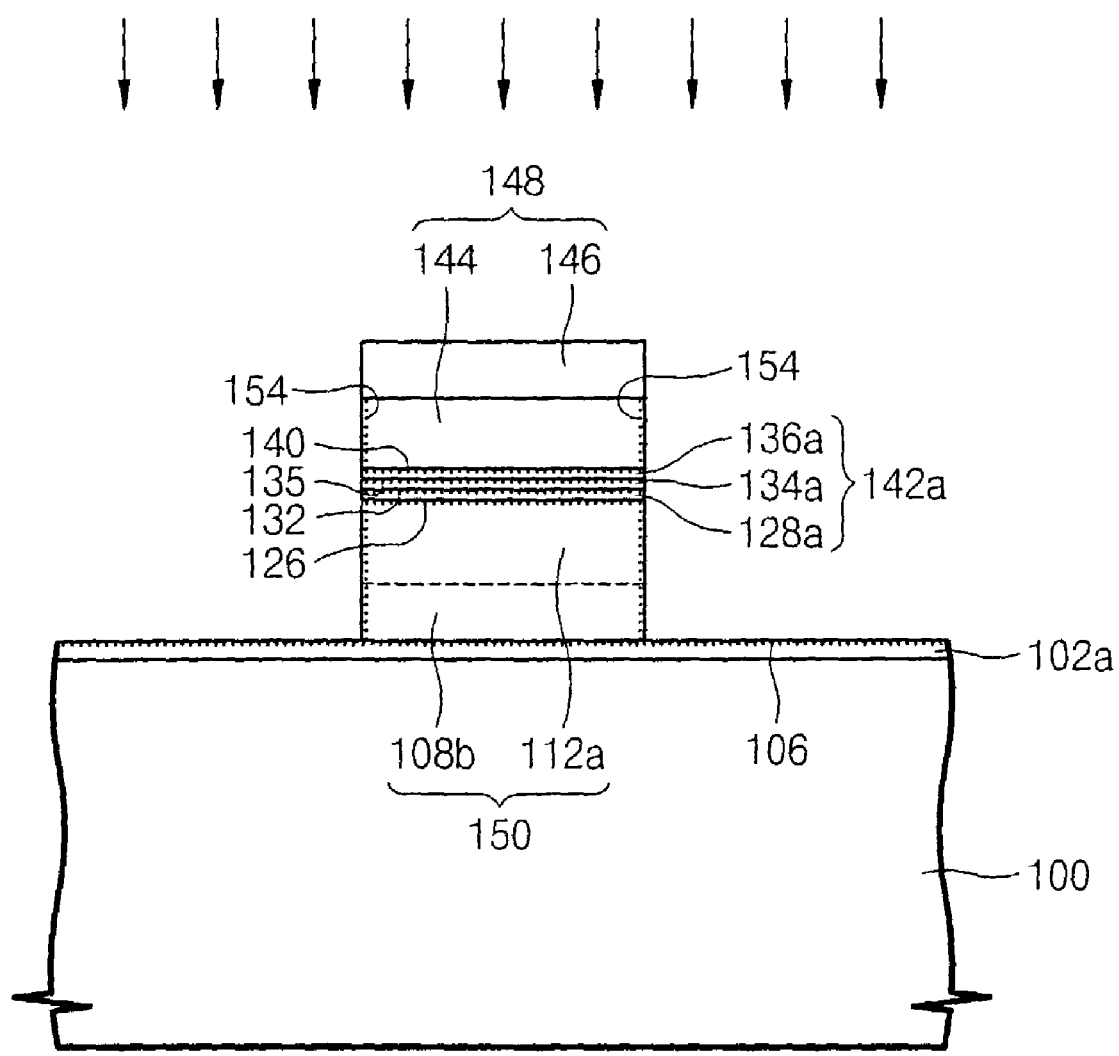
Figure 26:
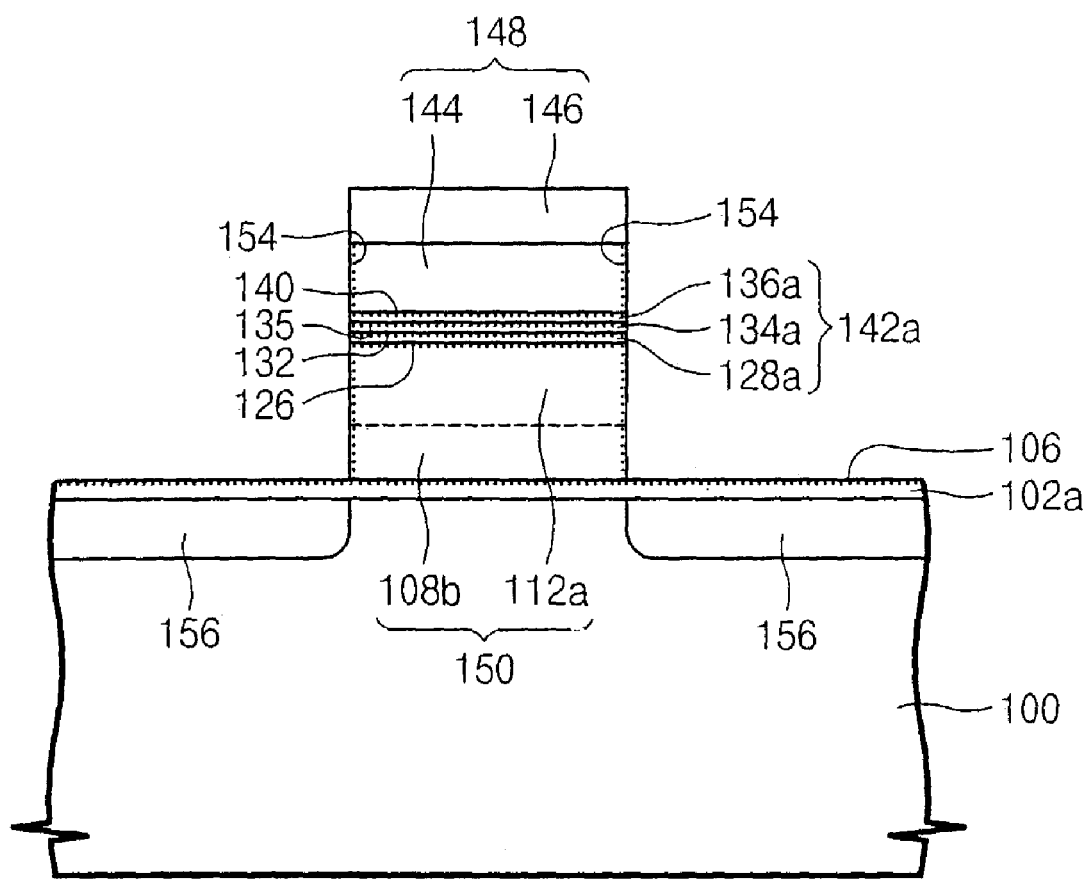

Referring now to FIGS. 25 and 26, a nitrogen doped layer 154 is formed on sidewalls of the stack gate and on the surface of the tunnel insulating layer 102a. The nitrogen doped layer 154 may be formed using the plasma nitridation process, using the RPN process, and/or by annealing the substrate in the gas including nitrogen ambient. The tunnel insulating layer 102a may be patterned to remain only at a lower portion of the floating gate pattern 150 during formation of the gate stack pattern. In this case, the nitrogen doped layer 154 may be formed on the sidewalls of the tunnel insulating layer interposed between the floating gate pattern 150 and the integrated circuit substrate 100. Source and drain regions S/D may be formed in the integrated circuit substrate adjacent to the stack gate pattern. It will be understood that any subsequent process may be performed using conventional methods.

As discussed above with respect to FIGS. 5 through 26, flash memory devices according to embodiments of the present invention include nitrogen doped layers formed in diffusion routes of oxygen atoms to reduce the likelihood of the formation of a bird's beak, i.e, the thickening of the edge of the tunnel insulating pattern and the intergate dielectric pattern. Accordingly, it may be possible to improve endurance and data retention characteristics of the integrated circuit device as well as to reduce a distribution of a threshold voltage in a cell array. A uniform edge of the intergate dielectric pattern may provide a lower coupling ratio, enhanced erase speed and enhanced write speed of the flash memory device.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a flash memory device comprising:

forming a stack gate structure on an integrated circuit substrate;

forming a trench isolation region on the integrated circuit substrate adjacent the stack gate structure, wherein the trench isolation region comprises a trench floor;

forming a first nitrogen doped layer on a portion of the stack gate structure adjacent a trench sidewall of the trench isolation region;

forming a trench insulating layer on the trench floor and a lower portion of the trench sidewall, wherein forming the first nitrogen doped layer comprises forming the first nitrogen doped layer such that it extends on an upper portion of the trench sidewall; and forming a tunnel insulating pattern between the integrated circuit substrate and the stack gate structure, wherein forming the stack gate structure comprises forming a floating gate, wherein forming the floating gate comprises forming a lower gate pattern on the tunnel insulating layer and forming an upper gate pattern on the lower gate pattern, wherein forming the first nitrogen doped layer comprises forming the first nitrogen doped layer such that it extends on a sidewall of the lower gate pattern and/or a sidewall of the tunnel insulating layer.

2. A method of forming a flash memory device comprising:

forming a stack gate structure on an integrated circuit substrate;

forming a trench isolation region on the integrated circuit substrate adjacent the stack gate structure;

forming a first nitrogen doped layer on a portion of the stack gate structure adjacent a trench sidewall of the trench isolation region;

forming a tunnel insulating pattern between the integrated circuit substrate and the stack gate structure, wherein forming the stack gate structure comprises forming a floating gate, wherein forming the floating gate comprises forming a lower gate pattern on the tunnel insulating layer and forming an upper gate pattern on the lower gate pattern and wherein forming the first nitrogen doped layer comprises forming the first nitrogen doped layer such that it extends on a sidewall of the lower gate pattern and/or a sidewall of the tunnel insulating layer;

forming a control gate electrode on the upper gate pattern of the floating gate;

forming an intergate dielectric pattern between the upper gate pattern of the floating gate and the control gate electrode, the intergate dielectric pattern comprising first, second and third layers;

forming a second nitrogen doped pattern on a surface of the upper gate pattern;

forming a third nitrogen doped pattern on a surface of the first layer;

forming a fourth nitrogen doped pattern on a surface of the second layer; and
forming a fifth nitrogen doped pattern on a surface of the third layer.

3. A method of forming a flash memory device according to claim 2, wherein forming the first layer comprises forming a layer of silicon oxide, wherein forming the second layer comprises forming a layer of silicon nitride and wherein forming the third layer comprises forming a layer of silicon oxide.

4. A method of forming a flash memory device according to claim 2, the method further comprising forming an insulating pattern in the trench isolation region such that the insulating pattern contacts the first nitrogen doped layer on the sidewall of the lower gate pattern and the sidewall of the tunnel insulating pattern.

5. A method of forming a flash memory device according to claim 4 wherein forming the second nitrogen doped layer comprises forming the second nitrogen doped layer extending onto a surface of the insulating pattern.

6. A method of forming a flash memory device according to claim 4 wherein forming the upper gate pattern of the floating gate comprises forming the upper gate pattern wider than the lower gate pattern such that the upper gate pattern extends on a surface of the insulating pattern.

7. A method of forming a flash memory device comprising:
forming a tunnel insulating pattern, a lower conductive pattern and a hard mask pattern that are sequentially stacked on an integrated circuit substrate;
etching the integrated circuit substrate adjacent to the tunnel insulating pattern using the hard mask pattern as an etch mask to form a pre-trench region with sidewalls aligned to sidewalls of the tunnel insulating pattern;
implanting nitrogen into a surface of the integrated circuit substrate having the pre-trench region to form a nitrogen doped layer on the sidewalls of the pre-trench region, the tunnel insulating pattern and lower conductive pattern;
etching the integrated circuit substrate at a bottom of the pre-trench region using the hard mask pattern as the etch mask to form a trench region;
applying a thermal oxidation process to the resultant structure having the trench region to provide a trench oxide layer on sidewalls of the trench region under the nitrogen doped layer and at a bottom of the trench region;
forming an insulating layer in the trench region to form an insulating pattern; and removing the hard mask pattern.

8. A method of forming a flash memory device comprising:
forming a tunnel insulating pattern and a lower conductive pattern that are sequentially stacked on an integrated circuit substrate;
forming a trench device isolation pattern aligned to sidewalls of the lower conductive pattern at the integrated circuit substrate adjacent to the tunnel insulating pattern;
forming an upper conductive pattern on the lower conductive pattern such that the edge of the upper conductive pattern overlaps an upper portion of the device isolation pattern;
forming a nitrogen doped layer on a surface of the upper conductive pattern by applying a plasma nitridation process to the integrated circuit substrate;
conformally forming a first silicon oxide layer on the upper conductive pattern;
forming a nitrogen doped layer on a surface of the first silicon oxide layer by applying the plasma nitridation process to the integrated circuit substrate;
conformally forming a silicon nitride layer on the first silicon oxide layer;
forming a nitrogen doped layer on a surface of the silicon nitride layer by applying the plasma nitridation process to the integrated circuit substrate;
conformally forming a second silicon oxide layer on the silicon nitride layer;
forming a nitrogen doped layer on a surface of the second silicon oxide layer by applying the plasma nitridation process to the integrated circuit substrate;
forming a gate conductive layer on the second silicon oxide layer; and
successively patterning the gate conductive layer, the second silicon oxide layer, the silicon nitride layer, the first silicon oxide layer, the upper conductive pattern and the lower conductive pattern, to form a stack gate pattern on the integrated circuit substrate.

9. A method of forming a flash memory device comprising:
forming trench device isolation patterns parallel to an integrated circuit substrate;
forming a stack gate pattern where a tunnel insulating pattern, a floating gate pattern and a control gate pattern are sequentially stacked on the integrated circuit substrate between the trench device isolation patterns;
forming a nitrogen doped layer on a surface of sidewalls of the stack gate by applying a plasma nitridation process to the integrated circuit substrate where the stack gate pattern is formed;
applying a thermal oxidation process to the integrated circuit substrate; and
forming a source/drain region aligned to the sidewalls of the stack gate pattern in the integrated circuit substrate adjacent to the stack gate pattern, wherein the device isolation pattern is formed so as to have sidewalls aligned to sidewalls of the tunnel insulating pattern and the floating gate pattern.

10. A method of forming a flash memory device comprising:
forming a tunnel insulating pattern, a lower conductive pattern and a hard mask pattern, which are sequentially stacked on a predetermined region of an integrated circuit substrate;
etching the integrated circuit substrate adjacent to the tunnel insulating pattern using the hard mask pattern as an etch mask to form a pre-trench region with sidewalls aligned to sidewalls of the tunnel insulating pattern;
implanting nitrogen into a surface of the integrated circuit substrate having the pre-trench region to form a nitrogen doped layer on the sidewalls of the pre-trench region, the tunnel insulating pattern and the lower conductive pattern;
etching the integrated circuit substrate on a bottom of the pre-trench region using the hard mask pattern as the etch mask to form a trench region;
applying a thermal oxidation process to the resultant structure having the trench region to form a trench oxide layer on sidewalls of the trench region under the nitrogen doped layer and at the bottom of the trench region;

forming an insulating layer in the trench region to form an insulating pattern;

removing the hard mask pattern;

forming an upper conductive pattern on the lower conductive pattern, wherein the edge of the upper conductive pattern overlaps an upper portion of the device isolation pattern;

conformally forming a first silicon oxide layer, a silicon nitride layer and a second silicon oxide layer on the upper conductive pattern;

forming a gate conductive layer on the second silicon oxide layer; successively patterning the gate conductive layer, the second silicon oxide layer, the silicon nitride layer, the first silicon oxide layer, the upper conductive pattern and the lower conductive pattern, to form a stack gate pattern on the integrated circuit substrate;

forming a nitrogen doped layer on a surface of sidewalls of the stack gate by applying a plasma nitridation process to the integrated circuit substrate where the stack gate pattern is formed;

applying the thermal oxidization process to the integrated circuit substrate; and forming a source/drain region aligned to the sidewalls of the stack gate pattern in the integrated circuit substrate adjacent to the stack gate pattern.

* * * * *